(12) United States Patent
Mazumder

(10) Patent No.: US 10,727,840 B2
(45) Date of Patent: Jul. 28, 2020

(54) PRE-DELAY ON-DIE TERMINATION SHIFTING

(71) Applicant: Micron Technology, Inc., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/392,474

(22) Filed: Apr. 23, 2019

(65) Prior Publication Data

US 2019/0334531 A1 Oct. 31, 2019

Related U.S. Application Data

(63) Continuation of application No. 15/965,663, filed on Apr. 27, 2018, now Pat. No. 10,367,512.

(51) Int. Cl.
| | |
|---|---|
| *H03L 7/08* | (2006.01) |
| *H03L 7/081* | (2006.01) |
| *G11C 7/10* | (2006.01) |
| *G11C 7/22* | (2006.01) |
| *G11C 11/4076* | (2006.01) |

(52) U.S. Cl.
CPC .......... *H03L 7/0818* (2013.01); *G11C 7/1051* (2013.01); *G11C 7/1057* (2013.01); *G11C 7/1066* (2013.01); *G11C 7/22* (2013.01); *G11C 7/222* (2013.01); *G11C 11/4076* (2013.01); *G11C 2207/2272* (2013.01)

(58) Field of Classification Search
CPC ... G11C 7/1051; G11C 7/1057; G11C 7/1066; G11C 7/22; G11C 7/222; G11C 11/4076; G11C 2207/2272; H03L 7/0818
See application file for complete search history.

(56) References Cited

U.S. PATENT DOCUMENTS

| | | | |
|---|---|---|---|
| 6,898,683 B2 | 5/2005 | Nakamura | |
| 6,928,007 B2 * | 8/2005 | Jin | G11C 7/1066 365/191 |

(Continued)

OTHER PUBLICATIONS

DDR3 SDRAM UDIMM Product Datasheet, Rev. J 2/16 EN, 2008, Micron Technology, Inc., 20 pages, retrieved from: https://www.micron.com/~/media/documents/products/data-sheet/modules/unbuffered_dimm/jsf9c128_256_512x72az.pdf.

(Continued)

*Primary Examiner* — Vanthu T Nguyen
(74) *Attorney, Agent, or Firm* — Perkins Coie LLP

(57) ABSTRACT

Memory systems can include shifting an ODT information signal prior to passing it through a cloned DLL delay line. The shifted ODT information passes through a cloned DLL delay line to move it into a DLL domain. Meanwhile, a clock gate can use a command indication to select whether to provide a clock signal to a DLL delay line. The clock gate can block the clock signal in the absence of a read or write operation and can pass the clock signal during read or write operations. When the DLL delay line receives the clock signal, it delays the clock signal to be in the DLL domain. By locating the ODT shifter before the cloned DLL delay line, as opposed to after it, the ODT shifter doesn't need a signal passed through the DLL delay line. Preventing the clock signal from passing through the DLL delay line reduces power consumption.

16 Claims, 4 Drawing Sheets

(56) References Cited

U.S. PATENT DOCUMENTS 8,963,597 B1 * 2/2015 Mazumder ............ H03L 7/0802
327/149
2011/0128794 A1 6/2011 Yoon et al.

OTHER PUBLICATIONS

DDR4 SDRAM SODIMM Product Datasheet, Rev. F 10/18 EN, 2016, Micron Technology, Inc., 23 pages, retrieved from: https://www.mouser.com/datasheet/2/671/aff4c512x64hz-1284544.pdf.
SDRAM DDR3 256M, 512M X 64 SODIMM Product Datasheet, Rev. Jul. 28, 2011, Spectek, (c) 2011 Micron Technology, Inc., 13 pages, retrieved from: http://www.spectek.com/pdfs/RN256_512MX64DDR3SODIMMV2.PDF.

* cited by examiner

PRE-DELAY ON-DIE TERMINATION SHIFTING

CROSS-REFERENCE TO RELATED APPLICATIONS

This application is a continuation of U.S. application Ser. No. 15/965,663, filed Apr. 27, 2018, which is incorporated herein by reference in its entirety.

TECHNICAL FIELD

The present disclosure is directed to improving power consumption in memory systems by providing a design that disables signaling to a delay circuit during certain on-die termination operations.

BACKGROUND

On-die termination (ODT) is a technology that improves signal integrity on a transmission line by establishing internal termination resistance for one or more devices. This terminal resistance prevents transition points that connect the one or more devices to the transmission line from causing reflection on the transmission line, resulting in noise. Devices can have internal ODT control logic to control whether to perform an ODT operation and how much internal termination resistance to apply.

Computing systems that use have a memory apparatus on the same transmission line as other memory apparatus or other components are instances in which ODT operations are typically used. When one component is performing an operation that uses a transmission line common to the memory apparatus, the memory apparatus is instructed to perform an ODT operation so that it does not interfere with the signal on the transmission line. In some implementations, this instruction to the memory apparatus is issued by setting an ODT pin on the memory apparatus to high when an ODT operation is needed (e.g. when the memory apparatus is not using the transmission line) and setting the ODT pin on the memory apparatus to low when an ODT operation is not needed (e.g. when the memory apparatus is using the transmission line, such as during a read or write operation). In some implementations, other ODT settings can override a nominal ODT setting, such as when dynamic ODT is active for a write operation.

Some memory systems use a delay-locked loop (DLL) circuit to calibrate an input clock to a correct phase. A DLL circuit can have multiple exit points, one of which can be selected when the DLL circuit is initialized to set what phase delay the DLL circuit will implement. When a memory apparatus uses a DLL circuit for an input clock, it shifts the input clock into a DLL domain. Any ODT instructions must also be shift into the DLL domain so that the resulting internal termination resistance will be applied with the correct timing. Signals described as "in a domain" may be synchronized such that signals in the same domain are synchronized to a common clock for the domain.

Some memory systems, such as the memory system 100 shown in FIG. 1, use a DLL delay line 180 to delay an input clock received on a CLKS 106 line in a first domain 150 and output on DLL line 110 in a DLL domain 160. In some implementations, the clock signal can be passed through a CLKS gate 170, which passes the clock signal from CLKS line 104 onto CLKS line 106 when CMD line 103 has a control signal indicating conditions such as a read, write, or ODT operation is in progress.

To synchronize ODT information received on Rtt CMD line 102, a clone 175 of the DLL delay line, for nominal ODT, is used to delay the ODT information to be in the DLL domain 160. Delayed ODT information is output on delayed Rtt CMD line 108. The delayed ODT information on delayed Rtt CMD line 108 can be shifted by RttNom shifter 185, using the delayed clock signal on DLL line 110, by an amount specified by a mode register (not shown). This shift may configure the ODT information to match, e.g., an amount of write latency of the memory system 100. RttNom shifter 185 can produce shifted and delayed ODT information on shifted and delayed Rtt CMD line 112. The shifted and delayed ODT information can control whether ODT termination is enabled at the memory system's I/O pins (DQ), which can be overridden by other ODT signals, e.g. when dynamic ODT is active.

BRIEF DESCRIPTION OF THE DRAWINGS

The techniques introduced here may be better understood by referring to the following Detailed Description in conjunction with the accompanying drawings, in which like reference numerals indicate identical or functionally similar elements.

DETAILED DESCRIPTION

Embodiments are provided herein for improved memory systems and for improved methods of controlling memory systems where the memory system performs shifting of an ODT information signal prior to passing the shifted ODT information signal through a cloned DLL delay line. In some implementations, a memory apparatus embodying this memory system can receive a clock signal through a clock input line and ODT information through an ODT pin that is set to rising or held high during an ODT operation and to falling or held low otherwise. The clock signal and ODT information can be used by an Rtt nominal shifter to shift the ODT information signal by a specified amount, which is controlled by a mode register. The shifted ODT information can pass through a delay line, which is a clone of the DLL delay line discussed below, to produce shifted ODT information that is delayed to be in the DLL domain. Meanwhile, the clock signal and an indication of a current command can also be provided to a clock gate. The clock gate can pass the clock signal to a DLL delay line only during read and write operations, while blocking the clock signal at other times, such as when the memory apparatus is performing an ODT operation (e.g. during IDD2NT). When the DLL delay line receives the clock signal, it can produce an output clock signal, delayed to be in the DLL domain.

By locating the ODT shifter before the cloned DLL delay line, as opposed to after it, the ODT shifter can perform the ODT shifting using a clock signal that doesn't need to pass through a DLL delay line. Thus, in circumstances where the memory system doesn't require a delayed clock signal to carry out a current command (e.g. when the memory system is performing ODT to prevent noise on a transmission line for other memory systems in a computing device) the clock signal doesn't have to pass through a DLL delay line. Preventing the clock signal from passing through the DLL delay line reduces power consumption. To accomplish this power savings, the clock signal that would otherwise be supplied to the DLL delay line can be gated such that the clock signal is blocked from flowing through the DLL delay line when the memory system performs an ODT command but flows through the DLL delay line during a read or write operation.

In various implementations, the DLL delay line can include multiple gates (e.g. upwards of fifteen) and blocking the clock signal from entering the DLL delay line can lower current used by the memory system, e.g. by upwards of 3 mA as compared to situations where current is used to drive the clock signal through the DLL delay line.

Figure 2:
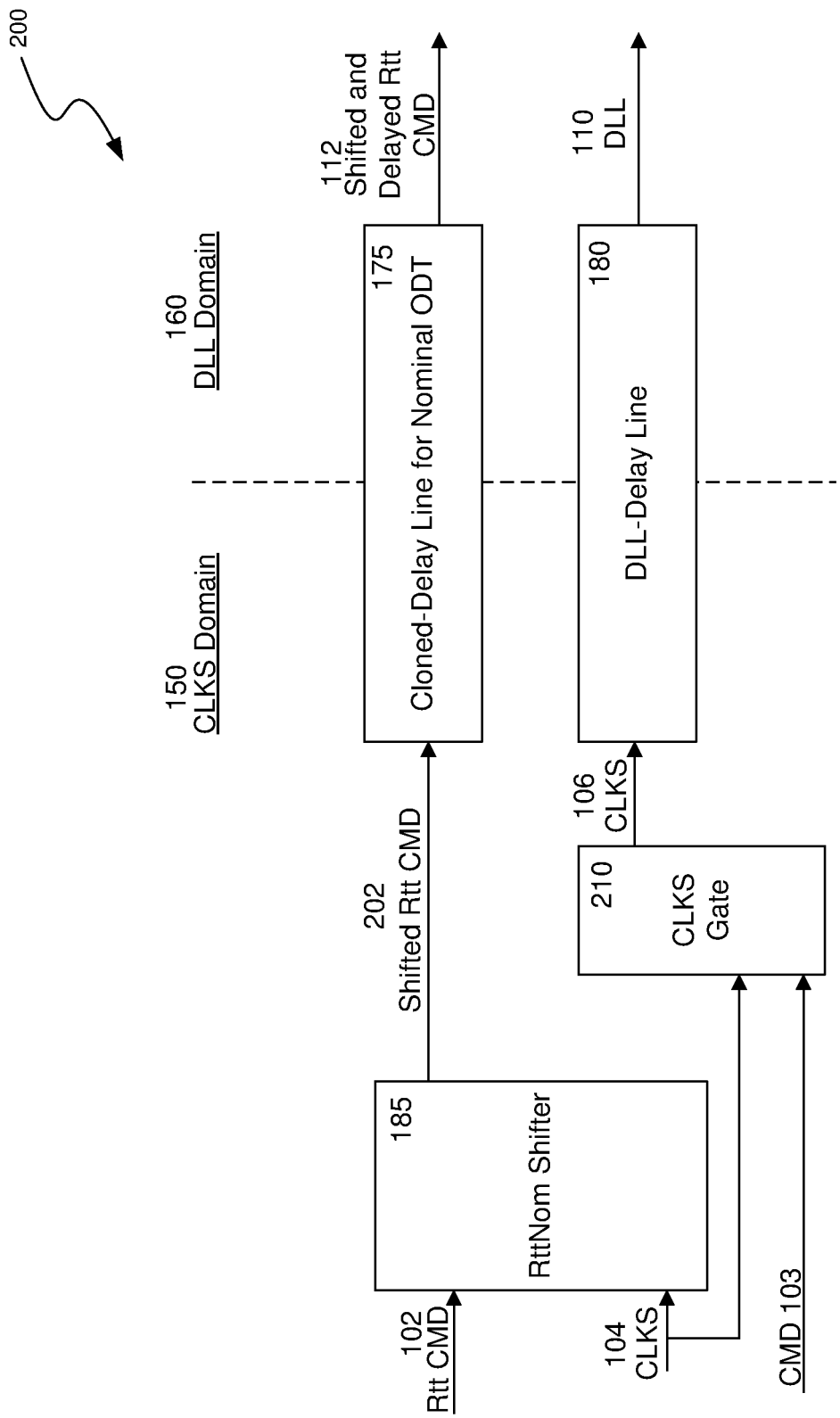
FIG. 2 is a block diagram illustrating implementations in which an ODT shifter is in a CLKS domain.

FIG. 2 is a block diagram illustrating a memory system 200 in which an ODT shifter is in the CLKS domain. The memory system shown in FIG. 2 includes RttNom shifter 185, cloned delay line for nominal ODT 175, CLKS gate 210, and DLL delay line 180.

Figure 1:
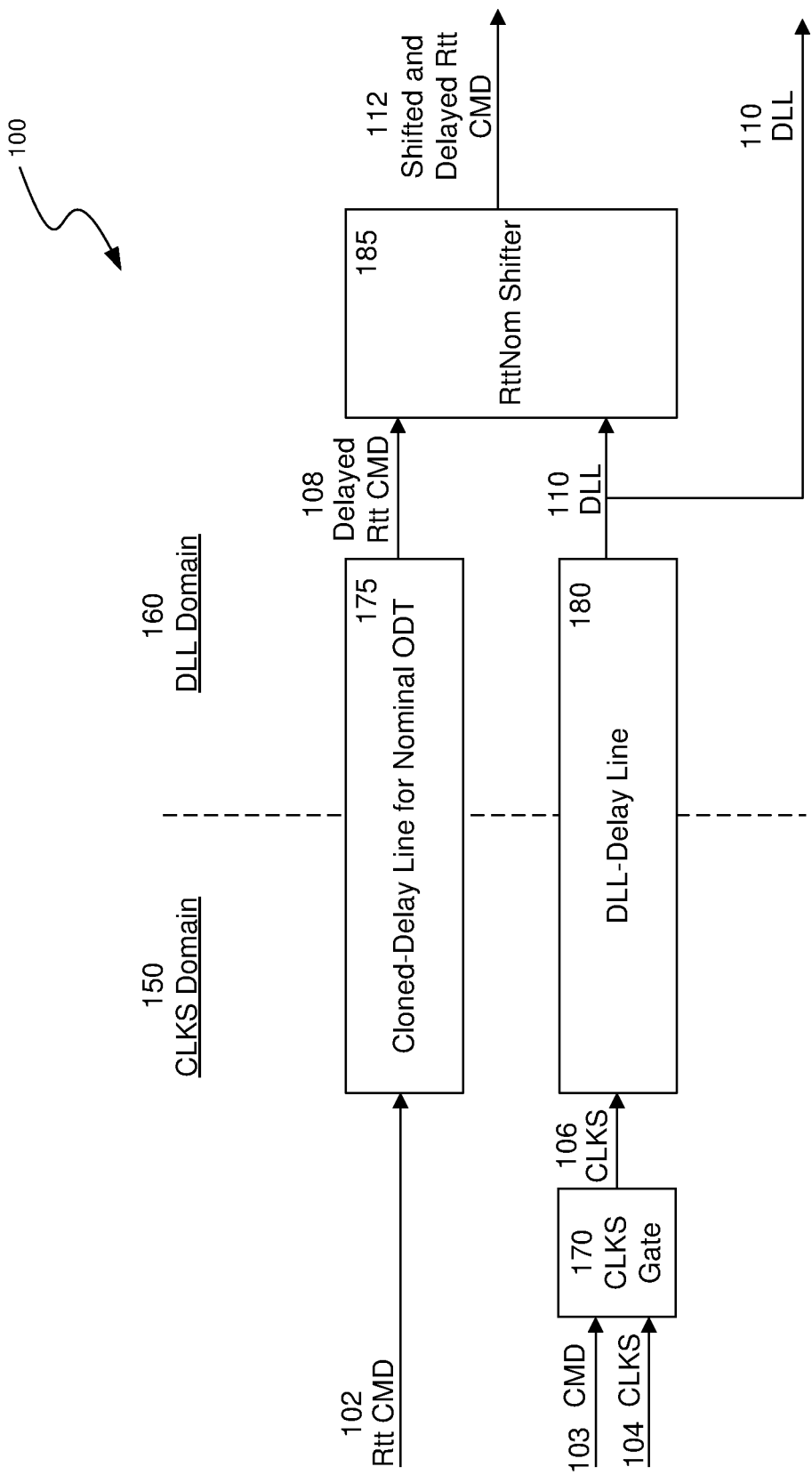
FIG. 1 is a block diagram illustrating a prior art system in which an ODT shifter is in a DLL domain.

In FIG. 2, cloned delay line for nominal ODT 175 and DLL delay line 180 are the same delay lines as in FIG. 1, where each transitions a signal from the CLKS domain 150 to the DLL domain 160. In memory system 200, the cloned delay line for nominal ODT 175 receives, from RttNom shifter 185 on shifted Rtt CMD line 202, shifted Rtt command information (e.g. ODT information such as a signal indicating whether an ODT pin is rising, falling, held high or held low). Cloned delay line for nominal ODT 175 then delays the shifted Rtt command information to be in the DLL domain, producing shifted and delayed Rtt command information on shifted and delayed Rtt CMD line 112. Also in FIG. 2, DLL delay line 180 receives a clock signal, in the CLKS domain, on CLKS line 106 if it was passed through CLKS gate 210. DLL delay line 180 then delays the clock signal to be in the DLL domain 160, producing a DLL clock signal on DLL line 110. The shifted and delayed Rtt command information and the DLL clock signal (when it is produced) are the same signals as are output by the system in FIG. 1. However, because the system in FIG. 1 propagates the DLL clock signal more often through DLL-Delay line 180 than the system in FIG. 2, the system in FIG. 2 uses less power to produce these same results.

The RttNom shifter 185 of memory system 200 may be configured in the same manner as the RttNom shifter 185 as in FIG. 1. However, the RttNom shifter 185 of memory system 200 is located in the CLKS domain 150 instead of the DLL domain 160. Thus, RttNom shifter 185 receives Rtt command information (e.g. ODT information such as a signal indicating whether an ODT pin is rising, falling, held high or held low) from Rtt CMD line 102 and receives clock signal on CLKS line 104. RttNom shifter 185 uses the clock signal to shift the Rtt command information a specified amount. In some implementations, the specified amount of shift is controlled by a mode register setting (not shown), which is also supplied to the RttNom shifter 185. Locating the RttNom shifter 185 in the CLKS domain, as opposed to the DLL domain, can change the path lengths that the ODT information signal traverses. However, the signal difference resulting from these path differences can be compensated for by applying various fuse-trims.

CLKS gate 210 conditionally passes, on CLKS line 106, the clock signal from CLKS line 104 to the DLL delay line 180. CLKS gate 210 can be configured to block the clock signal when the memory system is performing commands that do not require the propagation of the clock signal through the downstream portion of the clock tree (e.g., nominal ODT commands). The CLKS gate 210 blocks the clock signal from entering the DLL-Delay line 180 during "pure" ODT operations (i.e. operations where the clock signal is not needed by the memory device after shifting the command information). This blocking saves power consumption as compared to implementations where the clock signal passes through the DLL-Delay line 180, even during pure ODT operations. In some implementations, (as shown if FIG. 2) CLKS gate 210 receives control information indicating a current command on CMD line 103, separate from than the Rtt command information from Rtt CMD line 102, and uses this command information to select whether to pass through the clock signal. For example, the CMD line 103 can provide command information specifying a particular command code. In this example, the CLKS gate 210 can block the clock signal when the command code indicates an ODT command and can pass the clock signal through on other commands that require a DLL clock signal at the DQ, such as during a read or write command. In some implementations, in the absence of a signal on the CMD line 103, the CLKS gate 210 is open or disabled, blocking the clock signal from passing onto CLKS line 106. In some implementations, the CLKS gate 210 is closed or enabled only when CMD line 103 has a control signal indicating a read or a write command, passing the clock signal onto CLKS line 106.

Figure 3:
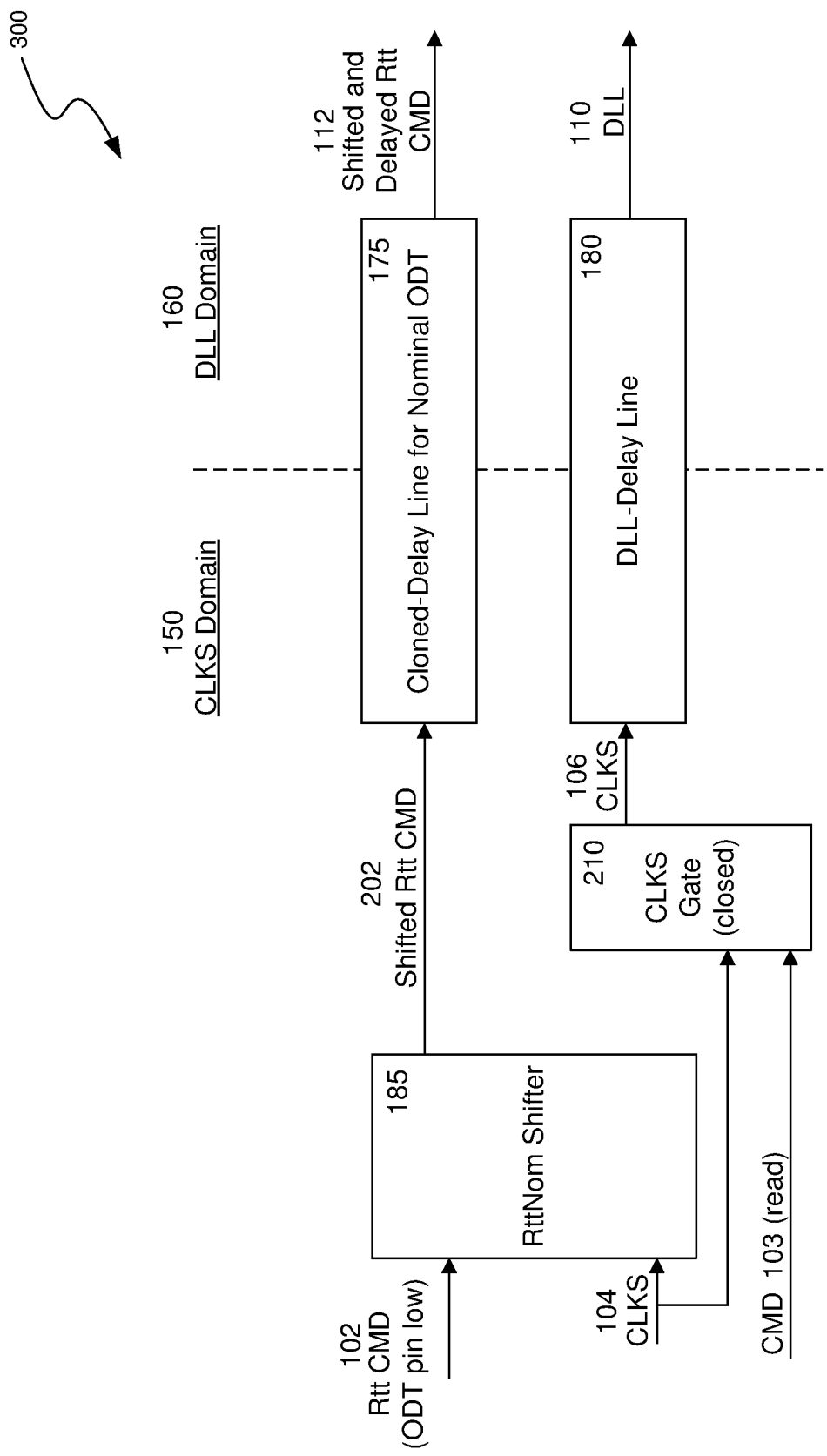
FIG. 3 is a block diagram illustrating an example of an ODT shifter in the CLKS domain when a read command is performed.

FIG. 3 is a block diagram illustrating an example 300 of an ODT shifter in the CLKS domain when a read command is being performed. Example 300 would operate similarly when a write command is being performed. The system used in example 300 is the system 200 from FIG. 2, with the CMD line 103 receiving a control signal indicating a read command. In example 300, the Rtt command information comes on line 102 from a signal indicating whether a signal on an ODT pin is rising, falling, held high, or held low. This Rtt command signal is shifted by RttNom Shifter 185, producing shifted ODT information on line 202. This shifted ODT information is delayed by cloned delay line for nominal ODT 175 to produce shifted and delayed ODT information on shifted and delayed Rtt CMD line 112. In example 300, because a read operation is being performed as indicated by the control signal on CMD line 103, the CLKS gate 210 is closed, passing the clock signal onto CLKS line 104 to flow through the DLL-Delay Line 180.

Figure 4:
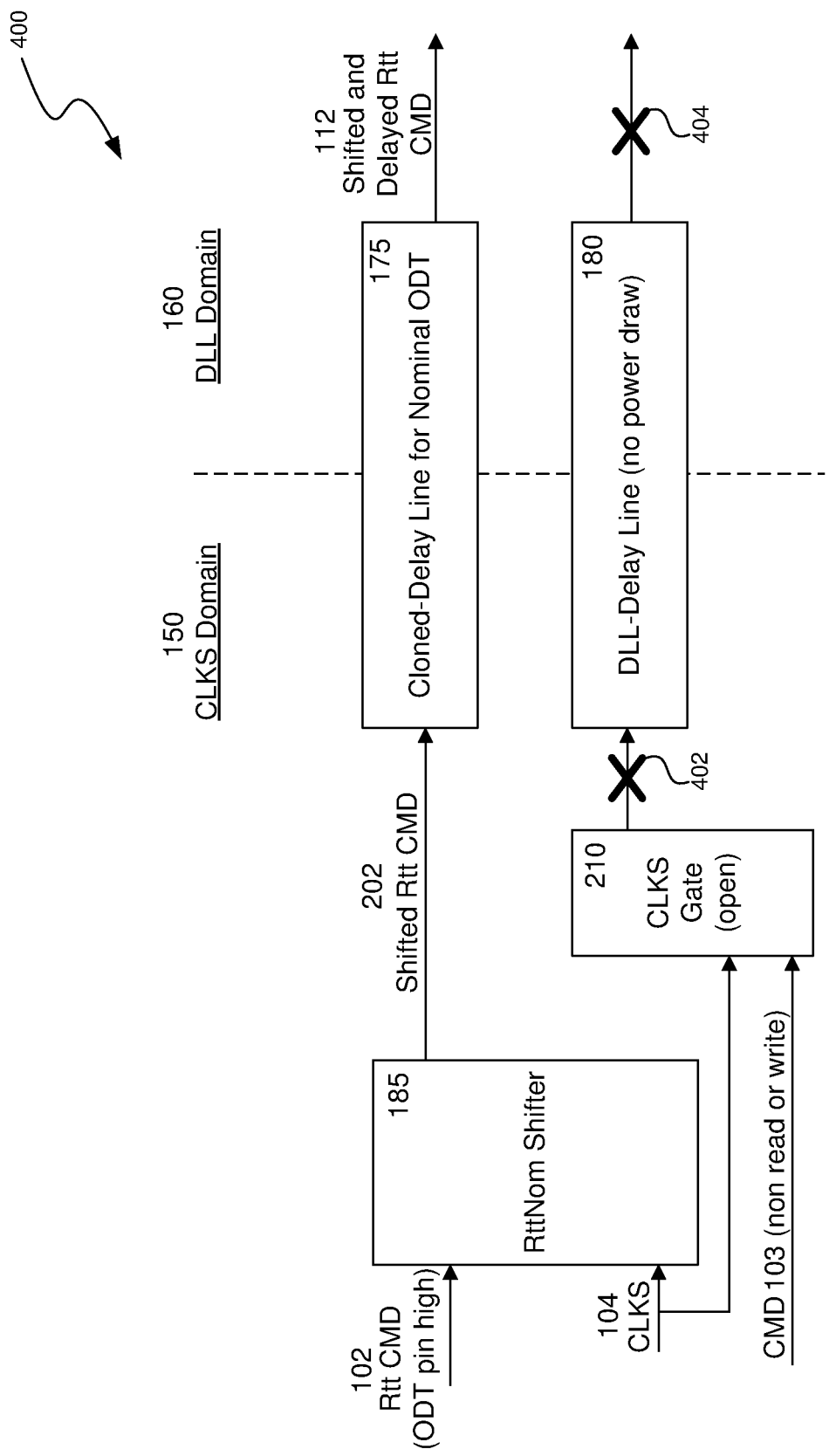
FIG. 4 is a block diagram illustrating an example of an ODT shifter in the CLKS domain when neither a read nor write command is being performed.

FIG. 4 is a block diagram illustrating an example 400 of an ODT shifter in the CLKS domain when neither a read nor write command is being performed. The system used in example 400 is the system 200 from FIG. 2, with the CMD line 103 receiving a control signal indicating a command other than a read or write. In example 400, the Rtt command information comes on line 102 from a signal indicating whether a signal on an ODT pin is rising, falling, held high, or held low. In example 400, an ODT operation is being performed and thus the ODT information on line 102 indicates ODT pin is set to high. This signal is shifted by RttNom Shifter 185, producing shifted ODT information on line 202. This shifted ODT information is delayed by cloned delay line for nominal ODT 175, to produce shifted and delayed ODT information on shifted and delayed Rtt CMD line 112.

In example 400, since there is no read or write command in progress, as indicated by the control signal on the CMD line 103, the CLK Gate 210 is disabled or open. Thus, as indicated by X 402 on CLKS line 106 and X 404 on DLL line 110, no clock signal is flowing along these paths or through DLL delay line 180. Accordingly, in example 400, DLL delay line 180 is not drawing current, saving power.

Several implementations of the disclosed technology are described above in reference to the figures. Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

I claim:

1. An apparatus, comprising:
    a signal shift circuit configured to receive a clock signal in a first domain and an information signal in the first domain and provide a shifted information signal that is shifted a specified amount;
    a delay locked loop (DLL) circuit configured to receive the clock signal in the first domain and provide a delayed clock signal in a DLL domain different from the first domain;
    a cloned DLL circuit configured to receive the shifted information signal from the signal shift circuit and produce a shifted and delayed information signal in the DLL domain; and
    a clock gate configured to receive the clock signal in the first domain and a control signal, wherein the clock gate blocks the clock signal when the control signal indicates an ODT command and allows the clock signal to pass to the DLL circuit in response to one or more commands other than the ODT command.

2. The apparatus of claim 1, wherein the clock gate is configured to prevent the clock signal from reaching the DLL circuit when the clock gate is not receiving the control signal.

3. The apparatus of claim 2, wherein, when the clock gate prevents the clock signal from reaching the DLL circuit, a current reduction of at least 3 mA is achieved as compared to when the clock gate provides the clock signal to the DLL circuit.

4. The apparatus of claim 1, wherein the clock gate is configured to prevent the clock signal from reaching the DLL circuit during precharge standby ODT (IDD2NT).

5. The apparatus of claim 1, wherein the apparatus is part of a DRAM device.

6. The apparatus of claim 1,
    wherein the DLL circuit comprises a first set of gates; and
    wherein the cloned DLL circuit comprises a second set of gates that has the same configuration as the first set of gates.

7. A method for selecting active circuits in a memory apparatus, the method comprising:
    providing, to a signal shift circuit, a clock signal and an information signal;
    receiving, from the signal shift circuit, a shifted information signal that is shifted a specified amount;
    in response to a control signal indicating a specified condition:
        controlling a gating circuit, based on whether the control signal indicates an ODT command, to provide, to a first delay locked loop (DLL) circuit, the clock signal; and
        receiving, from the first DLL circuit, a delayed clock signal;
    providing the shifted information signal to a second DLL circuit; and
    receiving from the second DLL circuit a shifted and delayed information signal.

8. The method of claim 7,
    wherein each of the clock signal, the information signal, the control signal, and the shifted information signal are in a first domain; and
    wherein each of the delayed clock signal and the shifted and delayed information signal are in a second domain different from the first domain.

9. The method of claim 7, wherein the specified condition is an indication that an output portion of the memory apparatus does not require an indication of the clock signal.

10. The method of claim 7, wherein the specified condition is the control signal indicating a read or a write command.

11. The method of claim 7,
wherein the DLL circuit comprises a first set of gates; and
wherein the cloned DLL circuit comprises a second set of gates that has the same configuration as the first set of gates.

12. The method of claim 7, wherein the control signal indicates the ODT command at least during precharge standby ODT (IDD2NT).

13. A system comprising:
shifting means for receiving a clock signal in a first domain and an information signal and for providing a shifted information signal that is shifted a specified amount;
first delay means for receiving the clock signal in the first domain and for providing a delayed clock signal in a DLL domain different from the first domain;
second delay means for receiving the shifted information signal from the shifting means and for producing a shifted and delayed information signal in the DLL domain; and
gate means for:
receiving the clock signal in the first domain and a control signal; and
allowing, based on whether the control signal indicates an ODT command, the clock signal to pass to the first delay means.

14. The system of claim 13, wherein the control signal does not indicate the ODT command, causing the gate means to pass the clock signal to the first delay means, when the control signal indicates at least a read or a write command.

15. The system of claim 13, wherein the system is part of a control DRAM device.

16. The system of claim 13, wherein the control signal indicates the ODT command at least during precharge standby ODT (IDD2NT).

* * * * *